(12) United States Patent
Mastromatteo

(10) Patent No.: US 6,653,655 B2
(45) Date of Patent: Nov. 25, 2003

(54) INTEGRATED SEMICONDUCTOR DEVICE INCLUDING HIGH-VOLTAGE INTERCONNECTIONS PASSING THROUGH LOW-VOLTAGE REGIONS

(75) Inventor: Ubaldo Mastromatteo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/055,029

(22) Filed: Jan. 22, 2002

(65) Prior Publication Data

US 2002/0123160 A1 Sep. 5, 2002

(30) Foreign Application Priority Data

Jan. 23, 2001 (IT) ...................... TO2001A0050

(51) Int. Cl.[7] .............................................. H01L 23/58
(52) U.S. Cl. ........................................ 257/48; 257/265
(58) Field of Search .......................... 257/48, 265, 271, 257/290, 337, 491, 501, 334, 499

(56) References Cited

U.S. PATENT DOCUMENTS 4,795,886 A * 1/1989 Carter, Jr.
5,187,554 A * 2/1993 Miwa
5,504,032 A   4/1996 Gessner et al. ................ 437/63
5,767,001 A   6/1998 Bertagnolli et al. ......... 438/455
6,036,842 A * 3/2000 Kato et al.

FOREIGN PATENT DOCUMENTS

DE          199 58 486 A1    12/2000

* cited by examiner

Primary Examiner—Phuc T. Dang
(74) Attorney, Agent, or Firm—Lisa K. Jorgenson; Harold H. Bennett, II; Seed IP Law Group PLLC

(57) ABSTRACT

The integrated semiconductor device includes a first chip of semiconductor material having first, high-voltage, regions at a first high-value voltage; a second chip of semiconductor material having second high-voltage regions connected to the first voltage; and a third chip of semiconductor material arranged between the first chip and the second chip and having at least one low-voltage region at a second, low-value, voltage. A through connection region is formed in the third chip and is connected to the first and second high-voltage regions; through insulating regions surround the through connection region and insulate it from the low-voltage region.

24 Claims, 3 Drawing Sheets

INTEGRATED SEMICONDUCTOR DEVICE INCLUDING HIGH-VOLTAGE INTERCONNECTIONS PASSING THROUGH LOW-VOLTAGE REGIONS

BACKGROUND OF THE INVENTION

1. Field of the Invention

The present invention relates to an integrated semiconductor device including high-voltage interconnections passing through low-voltage regions.

2. Description of the Related Art

As is known, passage of high-voltage interconnections on integrated circuits of semiconductor material, such as silicon, at voltages of over 100 V requires the adoption of sophisticated solutions at layout and process levels to overcome the effects of the charge induced in the semiconductor material and of charge movements in the dielectrics. In fact, in these situations, malfunctioning may occur in the integrated circuits.

The simplest solutions currently implemented to overcome the above-mentioned effects comprise providing field plates, i.e., electrostatic shields of semiconductor material, typically doped polycrystalline silicon or metal, extending between the interconnection lines and the areas to be protected. These field plates modify the electric field existing in critical areas, such as the insulations for positive-potential interconnections and N⁻ doped areas for negative-potential interconnections.

In addition, the thickness of the dielectric layer on which the interconnections extend increases as the voltages carried by the interconnections increase. Beyond a certain voltage value, however, the thickness becomes considerable and not always compatible with present processes and dimensional requirements. Consequently, whenever possible, the interconnections are made in "bridge" fashion, using bonding wires.

Particular problems are encountered in case of high voltages supplied to parts of devices formed on various wafers some of which are low-voltage ones. In this case, in fact, the various wafers house different parts of the device which are to be electrically and mechanically connected through bonding structures.

In particular, in these devices, the various parts are connected by interconnections of metal and strongly doped silicon which must be able to withstand high voltages and confine them so as to prevent the high electric fields associated thereto from damaging or hindering proper operation of the low-voltage parts.

BRIEF SUMMARY OF THE INVENTION

An embodiment of the present invention overcomes the limitations of the prior art by providing an interconnection system in a device formed in various wafers and including high-voltage parts and low-voltage parts.

According to an embodiment of the present invention, an integrated semiconductor device is provided, including a first chip of semiconductor material having first high-voltage regions at a first, high-value, voltage, a second chip of semiconductor material having second high-voltage regions at said first, high-value, voltage, a third chip of semiconductor material extending between said first and second chip and having at least one low-voltage region at a second, low-value, voltage, a through connection region formed in said third chip and connected to at least one of said first and second high-voltage regions, and through insulating regions surrounding and insulating said through connection region.

A method of operation is also provided, according to an embodiment of the invention.

BRIEF DESCRIPTION OF THE SEVERAL VIEWS OF THE DRAWING(S)

For a better understanding of the present invention, preferred embodiments thereof are now described, purely to provide non-limiting examples, with reference to the attached drawings, wherein.

DETAILED DESCRIPTION OF THE INVENTION

Figure 1:
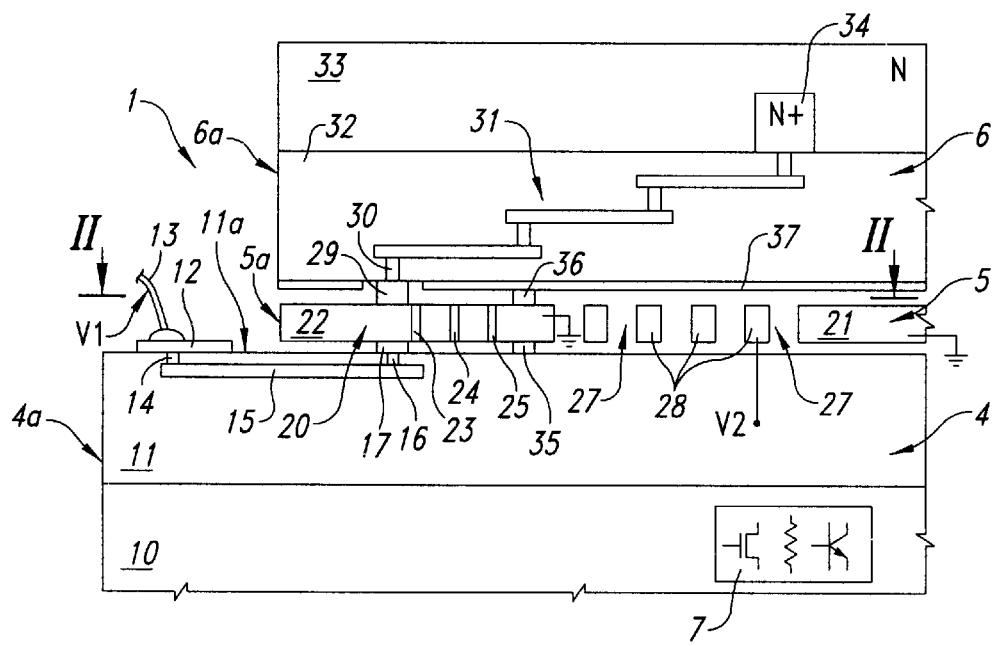
FIG. 1 illustrates a longitudinal section of a data storage device.

As shown in FIG. 1, a data-storage device 1 comprises three chips arranged on each other; namely, a bottom chip 4, which is supplied by a first, high-value, voltage V1 (higher than 100 V; for instance, 300, 500 or 1000 V), an intermediate chip 5 set, as a whole, at a low voltage, and a top chip 6 which must be supplied with the first voltage. The bottom chip 4 has larger dimensions than the intermediate chip 5 and the top chip 6, and projects laterally with respect to the other two at least on one side 4a (on the left in FIG. 1). In practice, the intermediate chip 5 and the top chip 6 have a respective side 5a and 6a which are mutually aligned and are set back with respect to the corresponding side 4a of the bottom chip 4.

In detail, the bottom chip 4 houses the low-voltage control circuitry 7 (schematically represented in FIG. 1 by electronic components) and comprises a first substrate 10 of semiconductor material (typically silicon) connected to ground. A first insulating layer 11 of dielectric material extends on the first substrate 10 of the bottom chip 4 and houses various metal levels (as may be better seen in FIG. 3); it moreover carries, on its surface 11a, in the area of the bottom chip 4 that projects with respect to the chips 5, 6, a pad region 12 connected, through an electric wire 13 and discrete components positioned on a printed-circuit card (not shown), to a high-voltage generator (not shown either), for example generating a voltage of 1000 V.

The pad region 12 is connected, through a first via 14, to a first end of a metal connection region 15 extending inside the first insulating layer 11 formed, for instance, in the last metal level so as to be set as far as possible away from the first substrate 10 of the bottom chip 4. A second end of the metal connection region 15 is connected, through a second via 16, to a first contact region 17, of metal, formed on the surface 11a of the first insulating layer 11, beneath the intermediate chip 5. Underneath the metal connection region 15 no components are present so as to prevent any malfunctioning and damage caused by the high electric field generated by the metal connection region 15.

The intermediate chip 5 is formed by a body 21 of semiconductor material set at a second voltage of a low value, for example ground. The body 21 houses a micromechanical storage structure including a suspended mobile structure 27 and a connection structure 20.

The suspended mobile structure 27 is set at at least one third voltage V2, with an absolute value lower than the first voltage V1 and different from the second voltage (for example, the third voltage is 3 to 10 V).

The connection structure 20 has the aim of transferring the first voltage from the bottom chip 4 to the top chip 6, and comprises a through connection region 22, which is insulated from the rest of the body 21 by three insulation regions 23, 24 and 25. The through connection region 22 is arranged on and in direct electrical contact with the first contact region 17. The insulation regions 23, 24, and 25, for example of silicon dioxide, are of the through type (and thus extend throughout the thickness of the intermediate chip 5), and each of them comprises (FIG. 2) a semicircular portion 23a, 24a, 25a and two rectilinear portions 23b, 24b, 25b. The semicircular portions 23a, 24a, 25a of the three insulation regions 23–25 are concentric and partially surround the through connection region 22. The rectilinear portions 23b, 24b, 25b are parallel to each other and extend tangentially from the two ends of the respective semicircular portion 23a, 24a, 25a, as far as the side 5a of the intermediate chip 5, so that the insulation regions 23–25 are U-shaped as seen in top view.

The suspended mobile structure 27, for example a translating microactuator, comprises a plurality of suspended regions 28 connected to the rest of the body 21 of the intermediate chip 5, in a per se known manner, by supporting arms (not shown).

A second contact region 29, preferably of metal, extends on and in direct electrical contact with the through connection region 22, and is vertically aligned to the first contact region 17. The second contact region 29 is connected, through a third via 30, to a first metal line structure 31 having a plurality of metal levels (here, three) that is formed in a second insulating layer 32 of the top chip 6. The second insulating layer 32 covers the bottom side of a second substrate 33 belonging to the top chip 6. The second substrate 33 must be biased at the first voltage and therefor houses an enriched contact region 34.

The top chip 6 houses a control circuit and carries a matrix of electron beam emitters, not shown and forming a probe of an atomic-resolution memory (not illustrated).

First and second spacer regions 35, 36 are respectively arranged between the bottom chip 4 and the intermediate chip 5, and the intermediate chip 5 and the top chip 6. The spacer regions 35, 36 are of insulating material if the substrate 33 of the top chip 6 is biased at a voltage of over 300 V. Alternatively, for lower voltages, the spacer regions 35, 36 may be formed of the same metal material of respectively the first contact region 17 and the second contact region 29. The second spacer regions 36, arranged between the intermediate chip 5 and the top chip 6, advantageously surround and seal the area of the top chip 6 containing the emitter matrix, as well as the area of the intermediate chip 5 comprising the suspended mobile structure 27. The gap between the top chip 6 and the intermediate chip 5 is, for example, 1.5 μm and is filled with air, nitrogen, or some other inert gas, or is set in vacuum conditions.

An insulating material layer 37 covers the bottom surface of the top chip 6.

Figure 3:
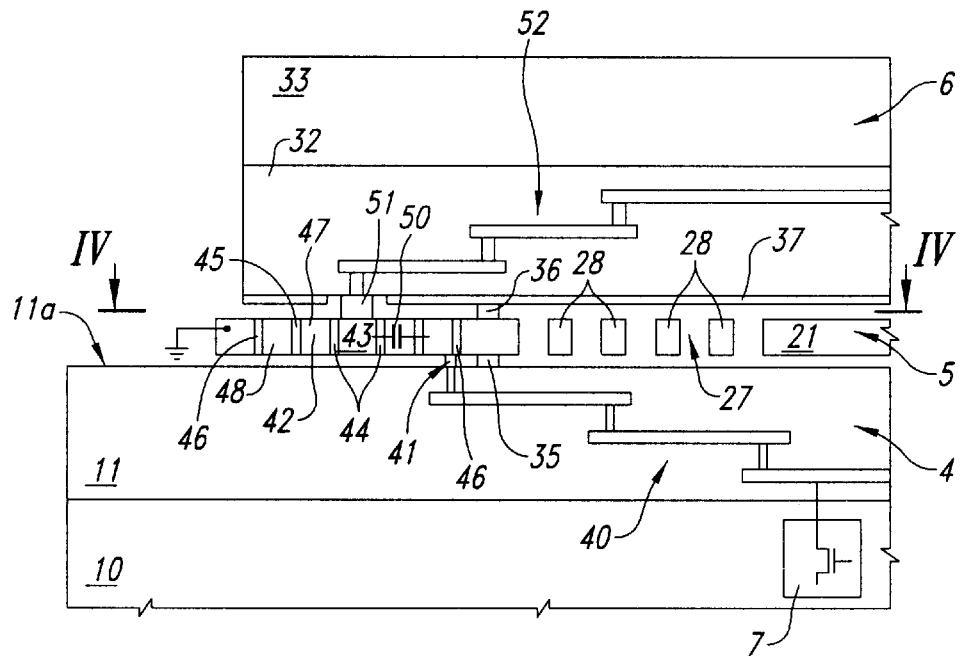
FIG. 3 shows a longitudinal section of the device of FIG. 1, taken along a sectional plane parallel to that of FIG. 1.
Figure 4:
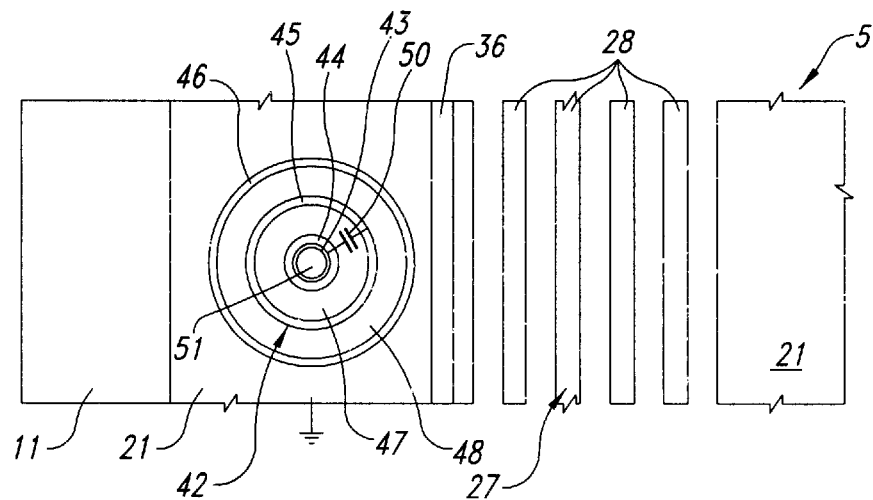
FIG. 4 is a cross-sectional view of the device of FIG. 3, taken along the line IV—IV.

FIGS. 3 and 4 show portions of the device 1 accommodating the electrical signal connections between the emitter matrix housed in the top chip 6 and the components of the circuitry 7, housed in the bottom chip 4. In particular, the electrical connections have the aim of bringing the electrical signal to the circuitry 7, uncoupling it from the first voltage V1 (high-value biasing voltage).

FIG. 3 shows a second metal line structure 40, formed inside the first insulating layer 11 of the bottom chip 4 using three metal levels and connecting a component of the circuitry 7, formed in the first substrate 10, to a third contact region 41 arranged on the surface 11a of the first insulating layer 11.

FIG. 3 shows the suspended mobile structure 27 of the intermediate chip 5. In addition, FIG. 3 shows a signal connection structure 42 formed inside the body 21. The signal connection structure 42 comprises a cylindrical region 43, of silicon, extending for the entire thickness of the intermediate chip 5 and surrounded by three insulation rings 44, 45 and 46 which are concentric to each other and to the cylindrical region 43. In particular, the insulation ring 44 surrounds the cylindrical region 43, and the insulation rings 44–46 delimit between them a first and a second annular semiconductor region 47, 48 (see also FIG. 4). The second annular semiconductor region 48 (the outermost one) is in direct electrical contact with the third contact region 41. The insulation rings 44–45, the annular semiconductor regions 47, 48, and the cylindrical region 43 form a capacitive element 50 including two series capacitors, of which the cylindrical region 43 and the annular semiconductor regions 47, 48 form the plates, and the insulation rings 44–45 form the intermediate dielectric. The insulation ring 46 (the outermost one) insulates the capacitive element 50 from the rest of the body 21.

The cylindrical region 43 is in direct electrical contact with a fourth contact region 51, of metal material and arranged between the intermediate chip 5 and the top chip 6. The fourth contact region 51 is electrically connected to a fourth metal line structure 52 having a plurality of levels (here, three) formed in the second insulating layer 32 of the top chip 6.

Thereby, electrical signals may be exchanged between the emitter matrix (not shown) formed in the top chip 6 and the circuitry 7 integrated in the bottom chip 4, with DC uncoupling via the capacitive element 50. In addition, the body 21 of the intermediate chip 5 can be electrically connected to ground even in the area immediately outside the insulation ring 46, notwithstanding the high voltage present in the cylindrical region 43 (for example, 300 or 1000 V).

In addition, thanks to the shape of the through portion 22 and to the absence of electronic components beneath the metal connection region 15, the device 1 has no structures that are to be kept at a low voltage (or even at ground voltage) above or below the metal connection region 15; consequently, the high electric field generated by the metal connection region 15 does not in any way jeopardize operation of any of the parts of the device 1.

The device 1 is manufactured as described hereinafter. Initially, the circuitry 7 is formed in a first wafer of semiconductor material, which is to form the bottom chip 4. Next, in a known way, the first insulating layer 11, the metal connection region 15, the third metal line structure 40, the pad 12, and the contact and spacer regions 17, 41 and 35 are formed. Either simultaneously or separately, deep trenches are formed in a second wafer of semiconductor material which is to form the intermediate chip 5, and are filled with insulating material to form the insulation regions 23–25 and the insulation rings 44–46. Deep trenches are moreover formed for defining the suspended mobile structure 27. The second wafer is turned upside down and bonded to the first wafer, and then its thickness is reduced until the insulation regions 23–25 and the insulation rings 44–46 are reached from the rear. Either simultaneously or separately, a third wafer, which is to form the top chip 6, is processed in such a way as to form the emitter matrix, the second insulating layer 32, the second and fourth metal line structures 31, 52, as well as the contact and spacer regions 29, 51, 36. Next, the third wafer is turned upside down and is bonded to the second wafer, and the wafers are cut.

Figure 5:
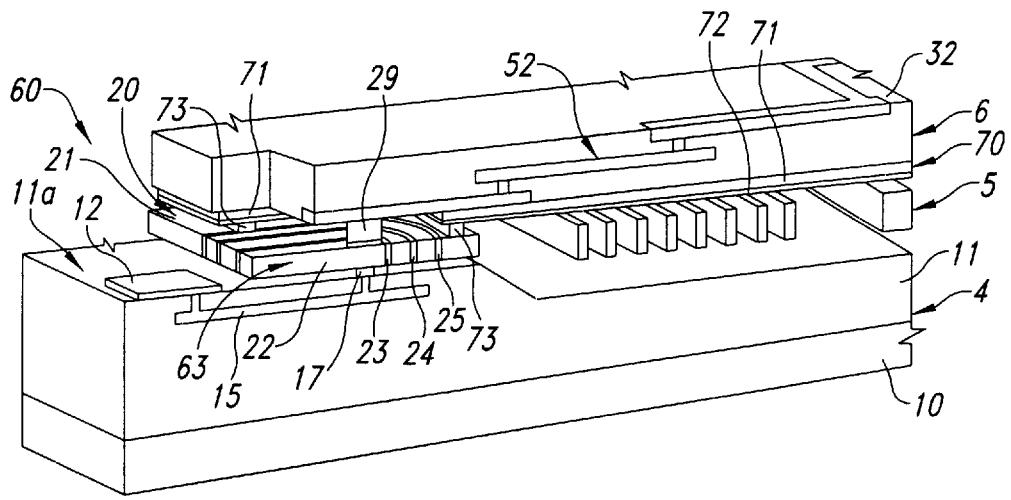
FIG. 5 is a perspective sectional view of a different embodiment of the device of FIG. 1.
Figure 6:
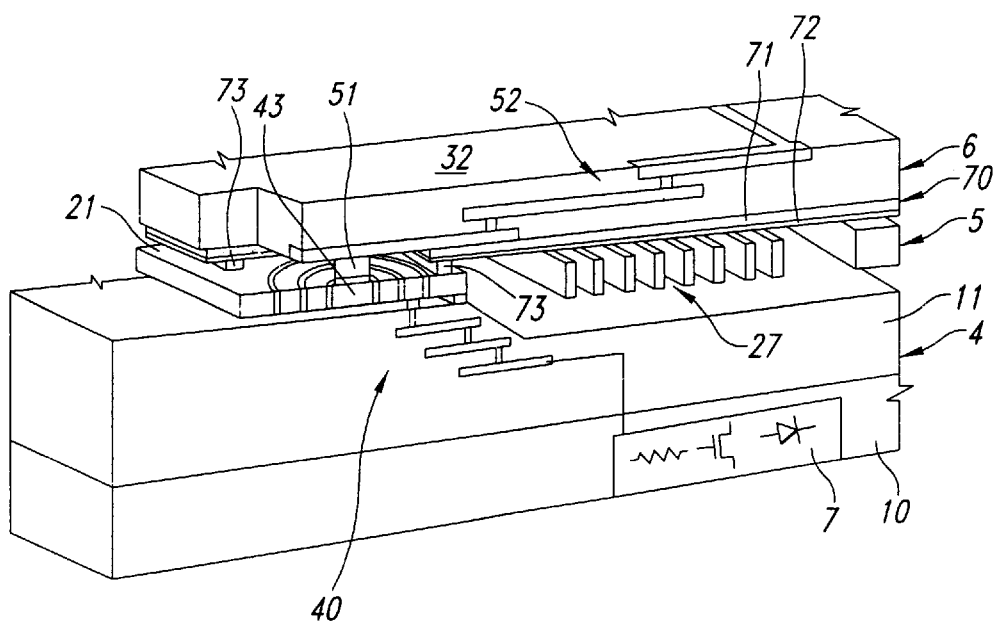
FIG. 6 is a perspective sectional view of the device of FIG. 5, taken along a sectional plane parallel to that of FIG. 5 and showing a different type of connection.

FIGS. 5–6 show a different embodiment of the device 1 illustrated in FIGS. 1–4, useful when the gap between the intermediate chip 5 and the top chip 6 is small (for example, 1.5 $\mu$m) and the voltage of the substrate 33 of the top chip 6 is high, so that an electric field greater than or equal to 200 V/$\mu$m is present. In fact, in the absence of adequate measures, this field value could cause the suspended mobile structure 27 to collapse.

To reduce this risk, according to FIGS. 5–6, an electrostatic-shield structure 70 is provided such as to reduce the area of the equivalent capacitor formed by the top chip 6 and the intermediate chip 5, which face each other, and by the dielectric (air or another gas) enclosed between them.

In detail, FIG. 5 shows a data-storage device 60 having a general structure similar to that of the data-storage device 1 of FIG. 1. Consequently, the parts of the device 60 of FIG. 5 that are the same as those of the device 1 of FIGS. 1–4 are designated by the same reference numbers and will not be described any further.

In FIG. 5, a medium-to-high voltage (for example 300 V) is carried by a pad 12 arranged on the bottom chip 4, through a metal connection region 15, to the first contact region 17 extending on the surface 11a of the first insulating layer 11.

Figure 2:
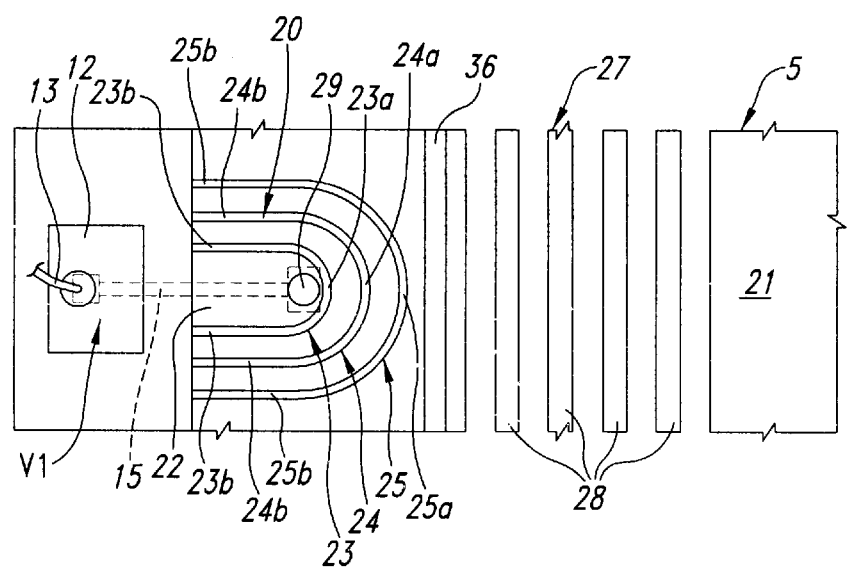
FIG. 2 is a cross-sectional view of the device of FIG. 1, taken along line II—II.

The intermediate chip 5 houses, in the connection portion 20, an insulation structure 63 equal to the connection portion 20 of FIGS. 1 and 2, and hence comprising a through connection region 22, insulated from the rest of the body 21 by three insulation regions 23, 24 and 25. The through connection region 22 is arranged on, and is electrically connected to, the first contact region 17. In addition, it is electrically connected to the second contact region 29. Consequently, the through connection region 22 and the first and second contact regions 17, 29 are at a high voltage (equal to the voltage applied to the pad 12); the body 21 of the intermediate chip 5, outside the insulation regions 23, 24 and 25, is at a low voltage (ground), and the conductive regions between adjacent pairs of insulation regions 23, 24 and 25 are at intermediate voltages between the high voltage and the low voltage.

The top chip 6 of FIG. 5, of which only the second insulating layer 32 and the second metal line structure 31 are shown, has the same structure as in FIG. 1, except for the fact that it supports an electrostatic-shield structure 70.

The electrostatic-shield structure 70 comprises a dielectric layer 71 and a conductive layer 72. The dielectric layer 71 is, for example, of a polymer, such as polyimide, extends on the bottom side of the top chip 6, and has a thickness of preferably 3–5 $\mu$m. The conductive layer 72 covers the surface of the dielectric layer 71 facing the intermediate chip 5, is preferably of metal (for example, aluminum), and has a thickness of, for instance, 0.5–1 $\mu$m.

The conductive layer 72 is electrically connected to the intermediate chip 5 by bump regions 73 of metal that extend between the conductive layer 72 of the electrostatic shield 70 and the intermediate chip 5. Specifically, the bump regions 73 are in direct electrical contact with the body 21 of the intermediate chip 5, and thus maintain the conductive layer 72 at the voltage of the intermediate chip 5 (i.e., ground voltage).

Thereby, the electrostatic-shield structure 70 extends between the top chip 6, at a high voltage, and the intermediate chip 5, and in particular the suspended mobile structure 27, so reducing the risk of collapse of the suspended mobile structure 27 towards the top chip 6.

The electrostatic-shield structure 70 is preferably formed by depositing and defining a dielectric material layer (for example, polyimide) on the surface of the second insulating layer 32 of a wafer that is to form the top chip 6 and in which the envisaged structures, such as the emitter matrices and the first metal line structures 31, are already provided. Thereby, the shield layer 71 is formed. Next, a metal layer is deposited and defined to form the conductive layer 72. Then, the bump regions 73 and the second contact regions 29 are formed in a known way, for example by making a negative mask of sacrificial material provided with openings where the bump regions 73 and the second contact regions 29 are to be formed, by depositing metal, and by removing the excess metal and subsequently the sacrificial material.

FIG. 6 shows the electrostatic-shield structure 70 in the area of the signal connections between the top chip 6 and the circuitry 7 integrated in the bottom chip 4, described in detail with reference to FIGS. 3 and 4.

Finally, it is evident that modifications and variations may be made to the devices described herein, without thereby departing from the scope of the present invention.

For example, the invention is applicable to any device including three chips arranged on top of one another and bonded together, wherein a high voltage (i.e., higher than 100 V) has to be brought between two end chips, whereas the intermediate chip is set at a low voltage, regardless of the type of microstructure and/or circuit made in the chips. In addition, the number of insulation regions 23–25 or of insulation rings 44–46 may be any whatsoever, with a minimum of two, according to the high voltage to be transferred and compatibly with the need to limit the overall dimensions associated thereto. Furthermore, the connection structure 20 shown in FIGS. 1 and 2 and the signal connection structure 42 shown in FIGS. 3 and 4 may even not coexist in the same device, should only one of them be required.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated semiconductor device comprising:
  a first chip of semiconductor material having first high-voltage regions at a first, high-value, voltage;
  a second chip of semiconductor material having second high-voltage regions at said first, high-value, voltage;
  a third chip of semiconductor material positioned between said first and second chip and having at least one low-voltage region at a second, low-value, voltage, the third chip including a through connection region connected to at least one of said first and second high-voltage regions; and
  a through insulating region surrounding said through connection region and insulating said through connection region from said low-voltage region.

2. The device according to claim 1 wherein said through insulating region comprises at least one first insulating region surrounding said through connection region and a second insulating region surrounding at a distance said first insulating region, a first semiconductor region extending between said first and second insulating regions.

3. The device according to claim 2 wherein said through insulating regions further comprise a third insulating region extending between said through connection region and said first insulating region, a second semiconductor region extending between said third and first insulating regions.

4. The device according to claim 2, wherein said through regions have a cylindrical tubular shape.

5. The device according to claim 4, wherein said first chip comprises a first substrate of semiconductor material; a first insulating layer on top of said first substrate; an electronic component formed at least partially in said first substrate; a second metal line structure formed inside said first insulating layer and connected between said electronic component and a third contact region formed on top of said first insulating layer and in electrical contact with said first semiconductor region; and wherein said second chip comprises a second substrate of semiconductor material; a second insulating layer on top of said second substrate; and a third metal line structure formed inside said second insulating layer and comprising a fourth contact region extending between said second insulating layer and said through connection region.

6. The device according to claim 1 wherein said first chip comprises a first substrate of semiconductor material; a first insulating layer on top of said first substrate; and an external connection structure extending at least partially on top of said first insulating layer and including a first contact region formed on top of said first insulating layer and in electrical contact with said through connection region, and wherein said second chip comprises a second substrate of semiconductor material; a second insulating layer beneath said second substrate; and a first connection line structure formed inside said second insulating layer; a second contact region extending between said second insulating layer and said third chip and being in electrical contact with said first connection line structure and said through connection region.

7. The device according to claim 6, wherein said external connection structure comprises an external pad region extending on said first insulating layer and a metal connection region extending inside said insulating layer and having a first end in direct electrical contact with said external connection region and a second end in direct electrical contact with said first contact region.

8. The device according to claim 7, wherein said through connection region has an elongated shape extending on said metal connection region, and said through insulating regions are substantially U-shaped.

9. The device according to claim 8, wherein each of said through insulating regions comprises a semicircular portion partially surrounding said through connection region and a pair of rectilinear portions extending from said semicircular portion as far as a side edge of said third chip outside said metal connection region in top view.

10. The device according to claim 1, further comprising a capacitive element formed between said through connection region and a low-voltage electronic circuit.

11. The device according to claim 1, further comprising a shield structure extending between said second chip and said third chip.

12. The device according to claim 11, wherein said shield structure comprises a dielectric layer extending on a face of said second chip facing said third chip, and a conductive layer covering said dielectric layer and facing said third chip.

13. The device according to claim 12, wherein said conductive layer is N electrically connected to said low-voltage region.

14. The device according to claim 12 wherein electrical connection regions of conductive material extend between, and are in electrical contact with, said conductive layer and said low-voltage region.

15. The device according to claim 12 wherein said dielectric layer is a polyimide layer.

16. A device comprising:
a first semiconductor substrate having a high voltage input terminal and a high voltage output terminal connected to the high voltage input terminal;
a second semiconductor substrate having a high voltage input terminal; and
a third semiconductor substrate positioned between the first and second semiconductor substrates and having a high voltage through connection region connecting the high voltage output terminal to the high voltage input terminal of the second substrate, and a through insulation region surrounding the through connection region, and wherein the third substrate further includes a low voltage region isolated from the through connection region by the through insulation region.

17. The device of claim 16 wherein the through insulation region comprises a plurality of insulation regions alternating with a plurality of semiconductor material regions and wherein the pluralities of insulation regions and semiconductor material regions are substantially concentric.

18. The device of claim 17 wherein the through insulation region is substantially U-shaped in top view, having a semicircular portion and a pair of rectilinear portions extending from the semicircular portion as far as a sidewall of the third semiconductor substrate, isolating thereby a portion of the third substrate outside the u-shaped through insulation region from the through connection region.

19. The device of claim 17 wherein the through insulation region is substantially circular in top view, isolating thereby a portion of the third substrate outside the through insulation region.

20. The device of claim 16 wherein the first semiconductor substrate includes an upper, insulating layer and wherein the high voltage input terminal of the first substrate and the high voltage output terminal are formed in the insulating layer.

21. The device of claim 20 wherein the first semiconductor substrate further includes a low voltage circuit formed in the semiconductor substrate and isolated from the high voltage input and output terminals of the first substrate by the insulating layer.

22. The device of claim 21 wherein the low voltage circuit is capacitively coupled to the high voltage output terminal.

23. The device of claim 16 wherein the third semiconductor substrate includes a micromechanical structure.

24. A device comprising:
a first semiconductor substrate;
a second semiconductor substrate positioned above the first substrate;
a third semiconductor substrate positioned above the second substrate;
means for receiving a high voltage supply to the first substrate;
means for transmitting the high voltage supply from the first substrate, through the second substrate to the third substrate;
means for receiving the high voltage supply to the third substrate; and
means for isolating the transmitting means from a low voltage region of the second substrate.

* * * * *

UNITED STATES PATENT AND TRADEMARK OFFICE
CERTIFICATE OF CORRECTION

PATENT NO.      : 6,653,655 B2                                                          Page 1 of 1
DATED           : November 25, 2003
INVENTOR(S)     : Ubaldo Mastromatteo It is certified that error appears in the above-identified patent and that said Letters Patent is hereby corrected as shown below:

<u>Title page,</u>
Item [73], the assignee should read as -- STMicroelectronics S.r.l., Agrate Brianza, Italy -- and -- Hewlett-Packard Company, Boise, Idaho --.

<u>Column 7,</u>
Line 66, "is N electrically connected" should read as -- is electrically connected --.

Signed and Sealed this

Sixteenth Day of March, 2004

JON W. DUDAS
*Acting Director of the United States Patent and Trademark Office*